United States Patent
Dromard et al.

(10) Patent No.: US 8,550,766 B2
(45) Date of Patent: Oct. 8, 2013

(54) METHOD AND DEVICE FOR ALIGNING COMPONENTS

(75) Inventors: Pascal Dromard, Montlebon (FR); Sébastien Maier, St. Aubin-Sauges (CH)

(73) Assignee: Ismeca Semiconductor Holdings SA, La Chaux-de-fonds (CH)

( * ) Notice: Subject to any disclaimer, the term of this patent is extended or adjusted under 35 U.S.C. 154(b) by 699 days.

(21) Appl. No.: 12/819,300

(22) Filed: Jun. 21, 2010

(65) Prior Publication Data

US 2010/0254788 A1 Oct. 7, 2010

Related U.S. Application Data

(63) Continuation of application No. PCT/EP2008/067752, filed on Dec. 17, 2008.

(30) Foreign Application Priority Data

Dec. 24, 2007 (EP) .................................. 07150412

(51) Int. Cl.
  *B65G 1/133* (2006.01)
(52) U.S. Cl.
  USPC ...................... 414/752.1; 198/468.2; 700/213
(58) Field of Classification Search
  USPC ............ 414/222.02, 751.1, 752.1; 198/468.2; 700/213, 214
  See application file for complete search history.

(56) References Cited

U.S. PATENT DOCUMENTS

| 6,044,169 A | 3/2000 | Hirotani et al. |
| 7,306,695 B2 * | 12/2007 | Kasai ........................... 156/702 |
| 2004/0238117 A1 | 12/2004 | Kasai |
| 2006/0088625 A1 | 4/2006 | Davis et al. |

FOREIGN PATENT DOCUMENTS

| EP | 1753284 A1 | 2/2007 |
| JP | 3160791 A | 7/1991 |
| JP | 2000133998 | 5/2000 |
| JP | 2003109979 | 4/2003 |
| JP | 2003243484 | 8/2003 |

OTHER PUBLICATIONS

International Search Report for PCT/EP2008/067752 dated Apr. 2, 2009.

* cited by examiner

*Primary Examiner* — Joshua Rudawitz
(74) *Attorney, Agent, or Firm* — Blank Rome LLP

(57) ABSTRACT

Method and apparatus for aligning a small-size component with vacuum pick-up nozzles within turrets used with electronic components or assembly equipments. The method comprises the steps of picking-up the component with a pick-up nozzle; measuring a position of the component in respect to a defined value; bringing the component held by the pick-up nozzle in contact with a aligning device; holding the component with the aligning device and; moving the aligning device in order to align the component based on the position measurement.

16 Claims, 6 Drawing Sheets

METHOD AND DEVICE FOR ALIGNING COMPONENTS

FIELD OF THE INVENTION

This invention relates generally to the handling of small-size components with vacuum pick-up nozzles within turrets used with electronic components or assembly equipments and more particularly to a component aligning method and apparatus for aligning a component in respect with the pick-up nozzle.

DESCRIPTION OF RELATED ART

During their manufacture, their conditioning or before being integrated onto a printed circuit, electronic components generally undergo a series of operations, for example electric tests, along a production line that is often entirely automated. The electronic components are thus transferred from one processing station to another by a conveyor, which can be for example linear or circular.

Circular conveyor are designed for transporting components of small size, and particularly electronic components, between a plurality of processing stations placed at the periphery of a revolving carrousel. These revolving conveyors are often used for manufacturing and conditioning electronic components, as mentioned above. However, devices of this type using an indexed carrousel are also used in other automation processes, for example for assembly, packaging and manufacturing processes requiring an accurate handling of small-size components and especially unprotected components.

With reference to FIG. 1, a circular turret 1 comprises a revolving barrel 2 that can take a plurality of indexed positions. Several regularly spaced locations of processing stations 3 are defined around the turret, each of which is generally occupied by a processing station performing one or several operations on the electric components presented to it. In certain cases, a processing station can occupy several locations. All the processing stations placed around the barrel thus form a cycle of successive operations that the component conveyed on the barrel undergo. The barrel 2 is equipped with component holders 4 serving to remove or receive the components from the different processing stations, to hold them during the barrels' movement and, if necessary, to present them to the following processing station.

In most cases, the barrel's component-holders 4 comprise a pick-up nozzle taking and holding the electronic components through air-vacuum.

The continuous evolution of the technology in the field of semi-conductors, especially unpackaged chips, has led to a general reduction of the electronic components' size, sometimes less than 1 mm$^2$, thus requiring a higher accuracy of the systems for processing these components, as well as a miniaturization of the handling elements of these systems.

In the case where a component is transferred from one pick-up nozzle to another receiving nozzle, the accurate positioning of the component with respect to the pick-up nozzle becomes critical. Indeed, in the case of components with a small mass and surface area the vacuum holding force becomes minimal at transfer, and often results in the component becoming displaced from the center line of the pick-up nozzle at the time the vacuum is switched to pressure. When the transfer operation is performed with minimal, if any, control of the x, y locations or angular orientation $\theta$ relative to the pick-up nozzle, a cumulative positioning error may be generated. In addition, misplacement of the component in the angular orientation $\zeta$ relative to a plane perpendicular to the nozzle may cause the vacuum seal not to occur relative to the receiving nozzle and the component can be lost altogether as it was being transferred between nozzles.

US2006088625 describes a microscopic die transfer process using a pair of pick-up and receiving nozzles having mating surfaces forming a cavity. The cavity allows to accurately maintaining the position of the die relative to the receiving nozzle, resulting in the reliable and accurate exchange of the die between the two nozzles. A different cavity shape must be machined for each dimension of the dies.

JP1965109 discloses the centering of a small electronic component absorbed on a vacuum pick-up nozzle by reciprocating the pick-up nozzle laterally in a recess. A similar method is also described in patent application JP59004515, where a small component taken out by a vacuum nozzle is positioned relative to the nozzle by bringing the component in contact with a stopper.

The methods described above allow for misalignment correction in the x and y directions only and the magnitude of correction is not well controlled.

U.S. Pat. No. 6,044,169 discloses the measurement of the misalignment of a component absorbed on a pick-up nozzle with a camera in respect to a receiving nozzle. The pick-up nozzle is moved in the x and y directions and rotated around its axis in order to align the component with the receiving nozzle. Here, the component misalignment with the pick-up nozzle itself is not corrected.

EP1753284 discloses an electronic component mounting device comprising a supply head device and a component mounting head device provided with a suction nozzle. The component is transferred from the supply head device to the mounting head supply. A recognition camera recognizes the component held by the mounting head device in order to align a mounting substrate with the component mounted on the mounting head device. The alignment is achieved by the movement of the substrate in the X and Y axis directions performed by a XY table.

Similar electronic component mounting apparatuses are disclosed in JP2003109979 and US20040238117. More particularly in JP2003109979, several pins are individually aligned with reference to the positions of semiconductor chips determined by a recognition camera, in order to push the chips from a wafer and pick them with a mounting head provided with several vacuum nozzles. In US20040238117, the position of a chip on a support sheet is determined by a recognition camera in order to position the chip, using a XY table, relatively to a pick-up head.

Document JP2003243484 discloses an electronic component mounting device comprising an ejector pin and a component mounting head device provided with a suction nozzle. A camera measures a position of the component held by the suction nozzle in order to align a mounting substrate with the component. Here, the ejector pin is used to detach the component from the substrate and not to align it.

JP2000133998 discloses a method comprising a step of bringing a component held by a pick-up nozzle in contact with an aligning device. The component is then aligned using two members of the aligning device pushing laterally on the side of the component. Here, the component is released from the nozzle when in contact with the aligning device and can freely move within the aligning device. Alignment can be performed only along the X-Y directions. In the methods described above the misalignment correction is performed in relation with the component position on the substrate and the position of the component on the pick-up or mounting head. The correction is also only performed in the x and y directions.

BRIEF SUMMARY OF THE INVENTION

An aim of the invention is therefore to propose a new method and apparatus which solve at least some problems of the prior art.

According to the invention, these aims are achieved by means of a method and an apparatus comprising the features of the independent claims, preferred embodiments being indicated in the dependent claims and in the description.

Those aims are also achieved by means of a method and an apparatus comprising:

- a pick-up nozzle capable of holding and transporting a component and connected to a source of negative and possibly positive pressure;
- means for measuring a misalignment of the component in respect to the pick-up nozzle or a calibration tool;
- aligning the component with an aligning device or aligning the test device, based on the misalignment measurement, and;
- an actuator for moving the aligning device or the test device in order to align the component or the test device respectively, based on the misalignment measurement.

The method and an apparatus of this invention enable to move the component or the test device in an x- and/or y-direction perpendicular to the plane of the aligning device or test device, and/or in an angular orientation θ relative to a rotation axis of the aligning device and/or along the angular orientation ζ relative to a plane perpendicular to the aligning device.

The proposed apparatus and method allow a small-size component to be aligned in respect with the pick-up nozzle, the calibration tool, or any other reference of the turret with increased accuracy and more freedom of movement compared with solutions of prior art.

BRIEF DESCRIPTION OF THE DRAWINGS

The invention will be better understood with the aid of the description and illustrated by the figures, in which.

DETAILED DESCRIPTION OF POSSIBLE EMBODIMENTS OF THE INVENTION

Figure 1:
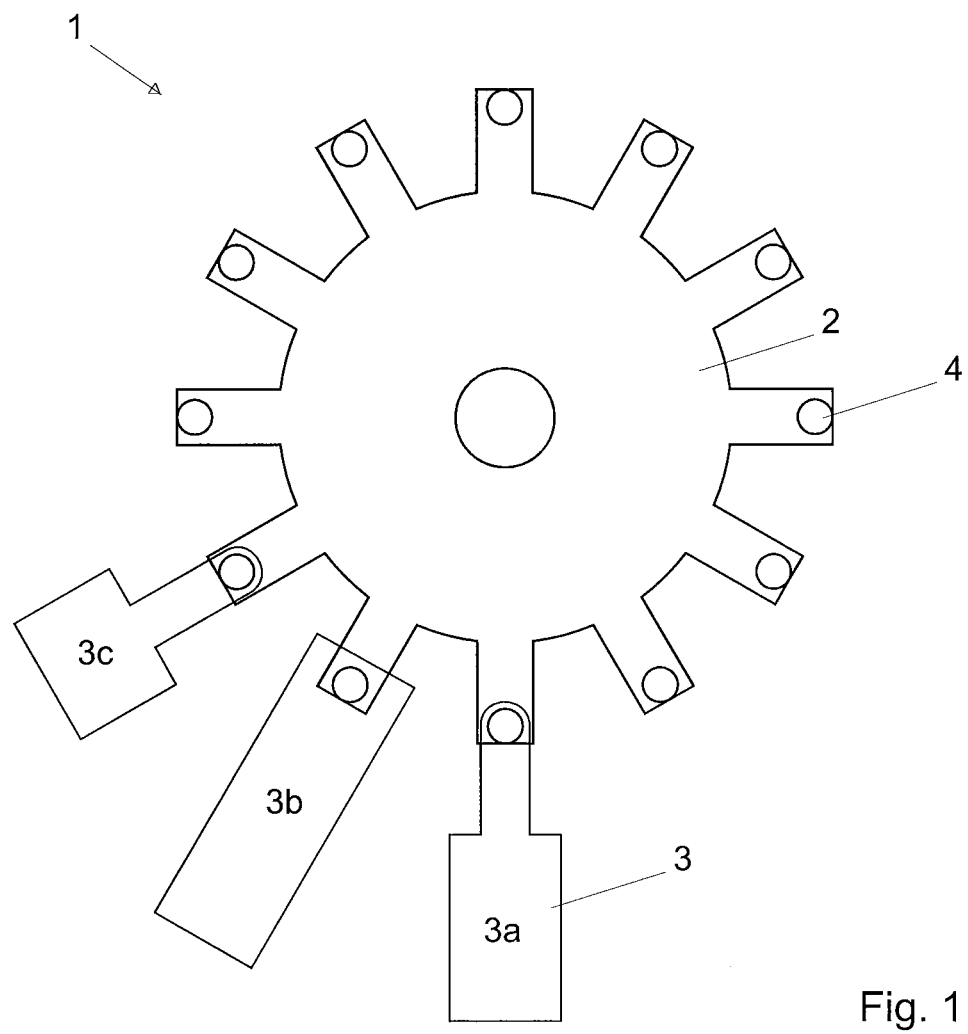
FIG. 1 shows the handling device comprising the circular turret with the processing stations.

Referring to the FIG. 1, a component handling device comprises the circular turret 1 comprising a revolving barrel 2 holding several pick-up nozzles (not shown). Several regularly spaced locations of processing stations 3 are located around the turret. In the present invention, the arrangement comprises at least a first processing station 3a for picking-up a component, a second processing station 3b for measuring the position of the component on the pick-up nozzle and a third processing station 3c for aligning the component on the pick-up nozzle or performing a series of tests such as, for example, a series of electrical tests.

Figure 2:
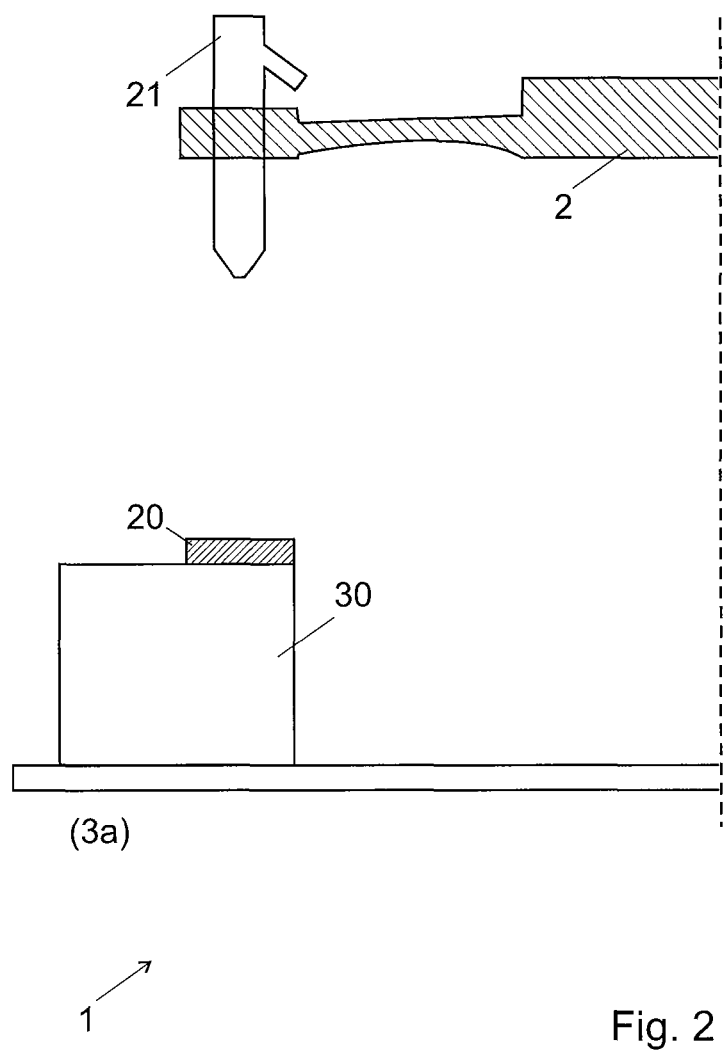
FIG. 2 shows the pick-up nozzle positioned in the first processing station to pick-up a component.

A schematic view of the first processing station 3a is shown in FIG. 2. The pick-up nozzle 21, fastened on one extremity of the barrel 2 is connected to a source of pressure (not shown) able to apply in a controlled fashion a negative and possibly a positive pressure to the nozzle. The barrel 2 is positioned such as to align the pick-up nozzle 21 with the component 20 located underneath, for example on a conveyor shown schematically by the numeral 30. The pick-up nozzle 21 is brought in contact with the superior surface 22 of the component 20 and picks-up the component 20 by applying a negative pressure to the nozzle.

Figure 3:
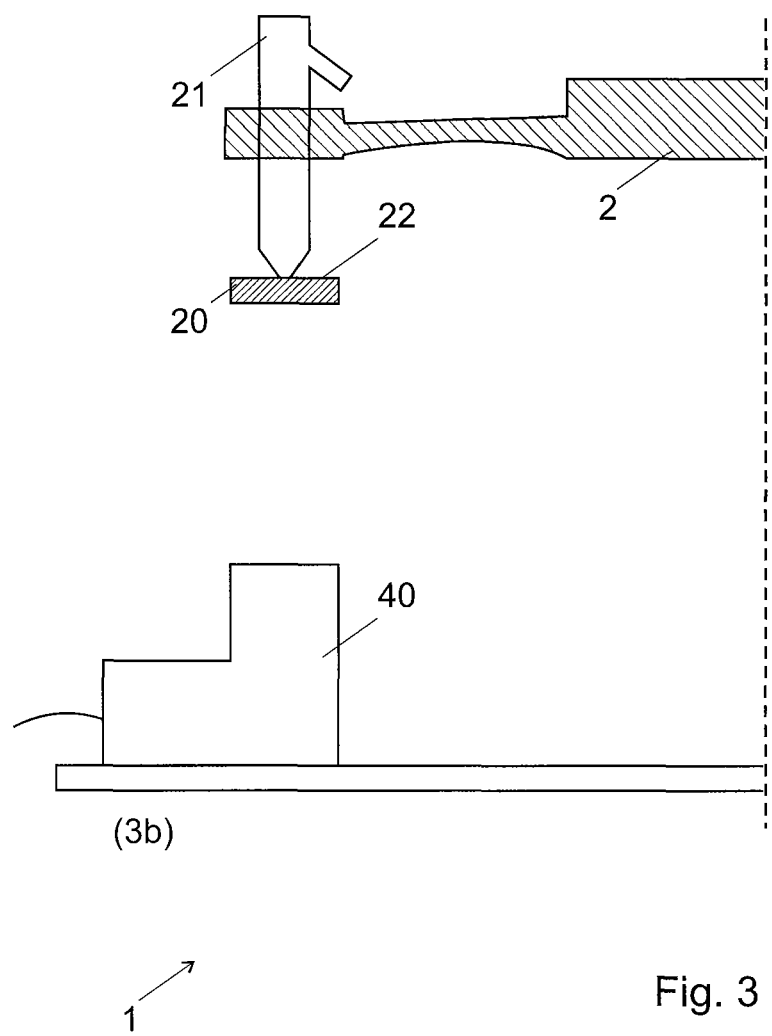
FIG. 3 shows the pick-up nozzle positioned in the second processing station, above the viewing camera.

FIG. 3 shows the second processing station 3b where the pick-up nozzle 21 holding the component 20 is moved above a camera unit 40. The camera 40 captures an image of the component 20 held on the pick-up nozzle 21 and, from the image, determine the component position values. These position values are compared to defined position values corresponding, for example, to the position values measured for a calibration tool well centered on the pick-up nozzle 21 or to any other reference position values. The difference between the position values measured by the camera 40 and the defined position values correspond to the misalignment of the component 20.

The calibration tool may comprise an alignment jig (not shown), located in one of the turret processing stations 3, and employing a large recess that is tapered down to the dimensions of the component 20. The taper on the alignment jig then serves to essentially "funnel" the component 20 into a precise alignment with the pick-up nozzle 21 when the pick-up nozzle 21 picks-up the component 20. The pick-up nozzle 21 with the precisely aligned component 20 is then moved above the camera unit 40 in order to acquire a defined position value. Other types of calibration tools are also possible.

The determination of the component position values is not limited to the use of a camera and can be performed by any other means, including other optical systems or mechanical position measuring systems.

Figure 4:
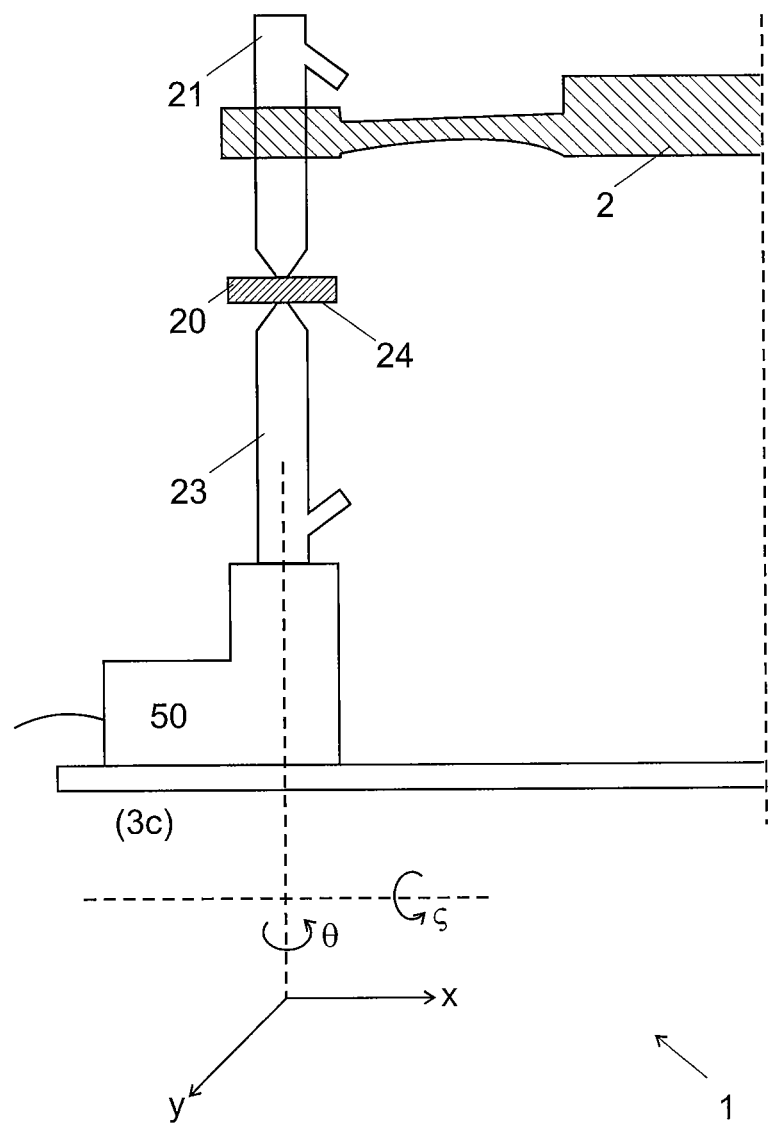
FIG. 4 shows the pick-up nozzle positioned in the third processing stations comprising the aligning nozzle.

After determining the position correction, the pick-up nozzle 21 holding the component 20 is moved to the third process station 3c shown in FIG. 4 and comprising a task device. In a first embodiment, the task device is an aligning nozzle 23, connected to a source of negative and possibly positive pressure (not shown) and an actuator 50 enabling the aligning nozzle 23 to move in the in an x- and/or y-direction perpendicular to the plane of the aligning nozzle 23 and/or in the angular orientation θ relative to the aligning nozzle 23 rotation axis and/or along the angular orientation ζ relative to a plane perpendicular to the aligning nozzle 23. The aligning operation comprises the steps of:

- bringing the surface 24 of the component opposite to the one held by the pick-up nozzle 21 in contact with the aligning nozzle 23;
- holding the component 20 on the aligning nozzle 23 by applying a negative pressure to the aligning nozzle 23 and subsequently releasing the component from the pick-up nozzle 21 by releasing the negative pressure on the pick-up nozzle 21;
- moving the component with the aligning nozzle 23 based on the position correction determined in the second process station 3b;
- holding the component 20 on the pick-up nozzle 21 by applying a negative pressure to the pick-up nozzle 21 and subsequently releasing the component from the aligning nozzle 23 by applying a positive pressure on the aligning nozzle 23.

The correction is performed by moving the aligning nozzle 23 in the x- and/or y-direction perpendicular to the plane of the aligning nozzle 23. The correction can also be performed along the angular orientation θ relative to the aligning nozzle 23 rotation axis and/or along the angular orientation ζ relative to a plane perpendicular to the aligning nozzle 23.

The position correction operation described above is performed with the pick-up nozzle 21 and aligning nozzle 23 being placed opposite in respect with both surfaces of the component 20. The holding control of the component can be passed between the two nozzles by applying a positive pressure to the aligning nozzle 23 or pick-up nozzle 21 and subsequently releasing the negative pressure on the pick-up nozzle 21 or aligning nozzle 23 respectively.

In one aspect of the first embodiment, the component 20 is moved by said aligning device (23, 25) without any contact between said pick-up nozzle (21) and the component (20).

In another aspect of the first embodiment, both nozzles remain in mechanical contact with the respective surfaces of the component 20 during the position correction process in order to facilitate the holding control and the transfer of the component 20 between the nozzles without any contact with the component edges and corners.

In yet another aspect of the embodiment, the component 20 remains held by the said pick-up nozzle 21 by applying a negative pressure to the pick-up nozzle 21, while the component 20 is moved by the aligning nozzle 23.

In yet another aspect of the embodiment, a positive pressure can be applied to the aligning nozzle 23 or the pick-up nozzle 21 in order to facilitate the releasing of the component from the aligning nozzle 23 or pick-up nozzle 21 respectively. The use of a positive pressure when releasing the component 20 from a nozzle is especially useful when the component surface tends to stick to the nozzle.

Figure 5:
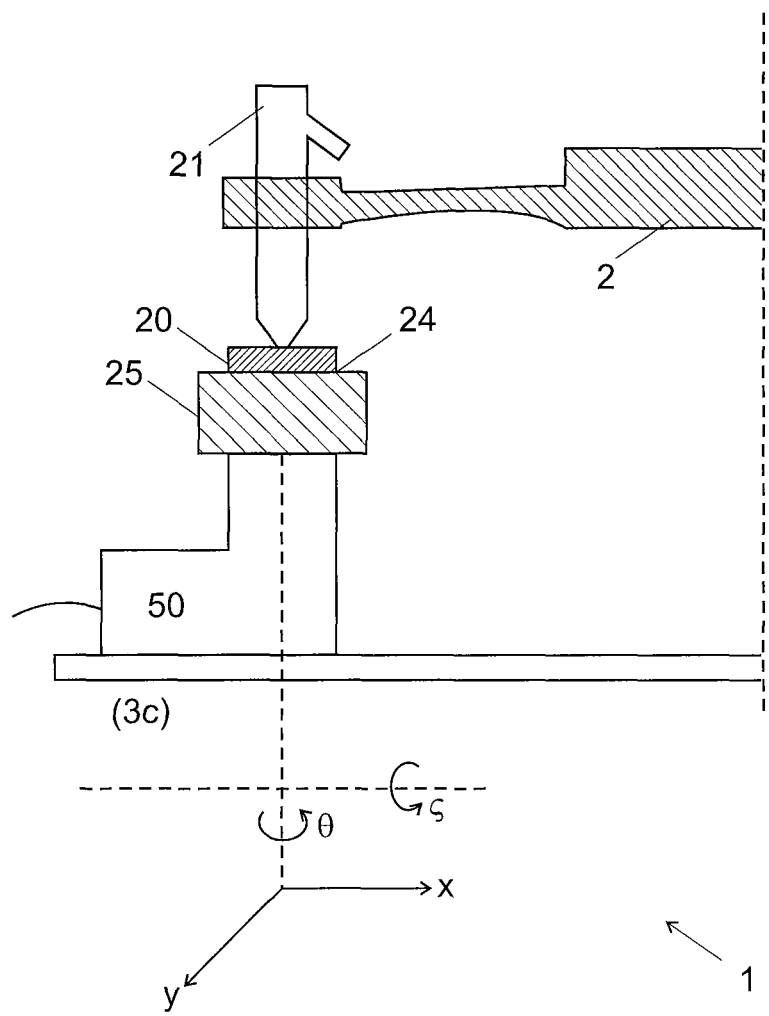
FIG. 5 shows another embodiment of the invention where the pick-up nozzle is positioned in the third processing stations above the aligning device.

In a second embodiment shown in FIG. 5, the third process station 3c comprises an alignment device 25 that is not connected to a source of negative pressure for the alignment of the component 20. An actuator 50 enables the aligning device 25 to move in the in an x- and/or y-direction perpendicular to the plane of the aligning device 25 and/or in the angular orientation θ relative to the aligning device 25 rotation axis and/or along the angular orientation ζ relative to a plane perpendicular to the aligning device 25. The aligning operation comprises the steps of:
  bringing the surface 24 of the component opposite to the one held by the pick-up nozzle 21 in contact with the aligning device 25;
  releasing the negative pressure on the pick-up nozzle 21;
  moving the component with the aligning device 25 based on the position correction determined in the second process station 3b;
  holding the component 20 on the pick-up nozzle 21 by applying a negative pressure to the pick-up nozzle 21.

During the aligning operation, both the pick-up nozzle 21 and the aligning device 25 are placed opposite in respect with both surfaces of the component 20 and remain in mechanical contact with the respective surfaces of the component 20.

The aligning device 25 can be a disc, a pin, a socket or have any other shape useful in contacting the component 20. The holding of the component 20 by the aligning device 25 can be facilitated by adding a cavity or a bevel on the surface 26 of the aligning device 25 contacting the component 20, or by making the surface 26 concave. The same purpose can be obtained by using a clamp as aligning device 25.

The correction is performed by moving the aligning device 25 in the x- and/or y-direction perpendicular to the plane of the aligning device 25 and/or along the angular orientation θ relative to the aligning device 25 rotation axis and/or along the angular orientation ζ relative to a plane perpendicular to the aligning device 25.

The steps of measuring the position of the component 20 on the pick-up nozzle 21 and aligning the component 20 on the pick-up nozzle 21 can also be performed on the same process station 3. To this end, the camera unit 40 or any other means, including other optical systems or mechanical position measuring systems, and the aligning nozzle 23 or aligning device 25, are located on the same processing station.

Figure 6:
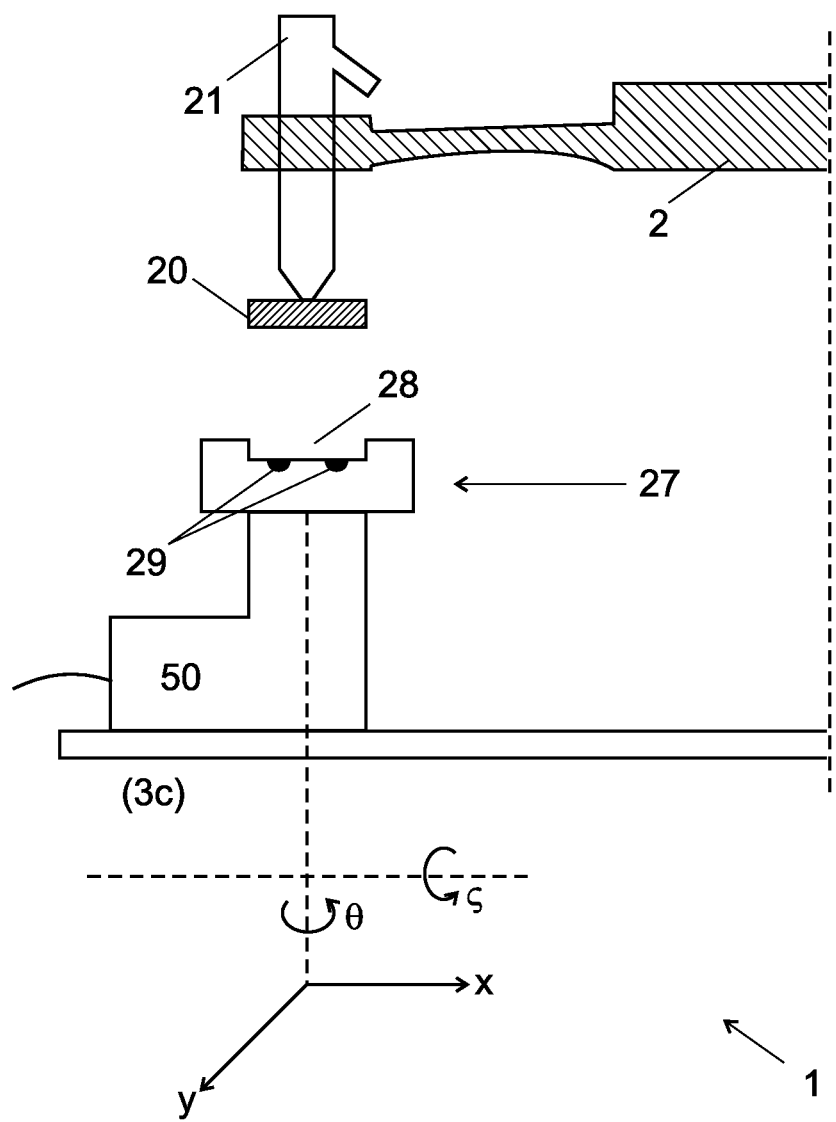
FIG. 6 shows another embodiment of the invention where the pick-up nozzle is positioned in the third processing stations above the test device.

In a third embodiment shown in FIG. 6, the task device of the third process station 3c is a test device 27 for performing a test or a series of tests on the component 20, for example, electrical tests. The test device 27 comprises a cavity 28 having dimensions mating with the shape and dimensions of the component 20. Electrical connectors are disposed on the surface of the cavity 28, two of these being illustrated in FIG. 6 by the numeral 29. Electrical connectors 29 are arranged to contact at least some of the electrical connectors (not shown) of the component 20. An actuator 50 enables the test device 27 to move in the in an x- and/or y-direction perpendicular to the plane of the test device 27, and/or in the angular orientation θ relative to the test device 27 rotation axis, and/or along the angular orientation ζ relative to a plane perpendicular to the test device 27. Here, the aligning operation comprises the steps of:
  align the test device 27 based on the position correction determined in the second process station 3b;
  bringing the component 20 held by the pick-up nozzle 21 within the cavity 28 of the test device 27;
  pressing the component 20 with the pick-up nozzle 21 against the surface of the cavity 28 in order to ensure proper electrical contact between the electrical connectors of the component and the electrical connectors 29 on the cavity 28;
  performing the testing.

Here, in contrast with the previous embodiments, the component 20 is not moved in respect with the pick-up nozzle 21. Instead, the test device 27 is moved in order to compensate for a possible misalignment of the component 20 on the pick-up nozzle 21, prior to the reception of the component 20 into the cavity 28. During the whole sequence of steps described above, the component 20 is held on the pick-up nozzle 21. Alternatively, the component 20 may also be released from the pick-up nozzle 21 by releasing the negative pressure on the pick-up nozzle 21 while performing the testing, after the component has been brought and pressed into the cavity 28. After the testing has been completed, the component 20 is picked-up by the pick-up nozzle 21 by applying a negative pressure to the nozzle.

The type of tests performed in the test device 27 is not limited to electrical tests and may comprise, for example, optical quality control testing of the electronic components 20 using an optical arrangement, or any other type of tests.

The proposed apparatus and method described above allow a small-size component to be aligned in respect with the pick-up nozzle 21, the testing device 27 or any other reference of the turret with increased accuracy and more freedom of movement compared with solutions of prior art. Reducing drastically vertical movement of the nozzle also simplifies the arrangement and allows for a faster aligning.

REFERENCE NUMBERS

1 Turret
2 Barrel

3 Processing station
3a First processing station
3b Second processing station
3c Third processing station
4 Component holder
20 Component
21 Pick-up nozzle
22 Superior surface of the component
23 Aligning nozzle
24 Surface of the component opposite to the superior surface
25 Aligning device
26 Surface of the aligning device contacting the component
27 Test device
28 Cavity
29 Electrical connectors
30 Conveyor
40 Camera
50 Actuator
θ Angular orientation relative to the aligning nozzle or aligning device rotation axis
ζ Angular orientation relative to a plane perpendicular to the aligning nozzle or aligning device

The invention claimed is:

1. An aligning method comprising the steps of:
    (a) picking-up a component with a pick-up nozzle by applying a negative pressure on the pick-up nozzle;
    (b) measuring a position of the component in respect to defined position values;
    wherein,
    (c) bringing the component held by the pick-up nozzle in contact with an aligning device;
    (d) holding the component with the aligning device; and
    (e) moving the aligning device, based on the position measurement in step (b), in the x-direction and/or y-direction perpendicular to a plane of the aligning device, and along an angular orientation relative to a rotation axis of the aligning device and/or along an angular orientation relative to a plane perpendicular to the aligning device, in order to align the component.

2. The aligning method according to claim 1, wherein said position is measured with a camera.

3. The aligning method according to claim 1, wherein the aligning comprises linear displacement along two orthogonal directions in a plane.

4. The aligning method according to claim 1, wherein the aligning comprises at least one rotation relative to a rotation axis.

5. The aligning method according to claim 1, wherein bringing said pick-up nozzle and said aligning device in contact with opposing surfaces of the component.

6. The aligning method according to claim 1, wherein moving the component while it is in contact with both pick-up nozzle and the aligning device.

7. The aligning method according to claim 1, wherein said component is moved by said a aligning device without any contact between said aligning device and the lateral faces of said component.

8. The aligning method according to claim 6, said aligning device being an aligning nozzle, wherein said component is held by applying a negative pressure to the aligning nozzle when it is moved, wherein, after completion of the alignment, the component is held by applying a negative pressure to the pick-up nozzle and subsequently releasing the negative pressure from the aligning nozzle.

9. The aligning method according to claim 8, wherein the component remains held by the pick-up nozzle by applying a negative pressure to the pick-up nozzle, while the component is moved by the aligning nozzle.

10. The aligning method according to claim 8, wherein by applying a zero or positive pressure to the aligning nozzle or pick-up nozzle and subsequently releasing the negative pressure on the pick-up nozzle or aligning nozzle respectively in order to pass the holding control of the component between the two nozzles.

11. A component handling device for performing a method according to claim 1, the device comprising:
    a pick-up nozzle capable of holding and transporting a component and connected to a source of negative pressure;
    means for measuring a position of the component in respect to defined position values;
    wherein,
    an aligning device configured to hold the component; and
    an actuator for moving the aligning device based on the position measurement, in the x-direction and/or y-direction perpendicular to a plane of the aligning device, and along an angular orientation relative to a rotation axis of the aligning device and/or along an angular orientation relative to a plane perpendicular to the aligning device, in order to align the component.

12. A component handling device according to claim 11, wherein said actuator is adapted to move linearly the aligning device along two orthogonal directions in a plane.

13. A component handling device according to claim 11, wherein said actuator is adapted to rotate the aligning device relative to at least one rotation axis.

14. A component handling device according to claim 11, wherein a camera unit for capturing an image of the component while held on the pick-up nozzle as means for measuring a position of the component.

15. A component handling device according to claim 11, wherein the aligning device is an aligning nozzle connected to a negative pressure source.

16. A component handling device according to claim 11, wherein the aligning device is a pin, a disc, or a socket as aligning device.

* * * * *